(12) United States Patent
Lee

(10) Patent No.: US 11,049,569 B2
(45) Date of Patent: Jun. 29, 2021

(54) CONTROLLER AND OPERATING METHOD THEREOF

(71) Applicant: SK hynix Inc., Gyeonggi-do (KR)

(72) Inventor: Jae-Yoon Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 232 days.

(21) Appl. No.: 16/406,144

(22) Filed: May 8, 2019

(65) Prior Publication Data

US 2020/0066356 A1 Feb. 27, 2020

(30) Foreign Application Priority Data

Aug. 21, 2018 (KR) ........................ 10-2018-0097472

(51) Int. Cl.
*G11C 16/26* (2006.01)
*G11C 16/04* (2006.01)
*G11C 11/56* (2006.01)
*G06F 3/06* (2006.01)
*G11C 29/52* (2006.01)

(52) U.S. Cl.
CPC ............ *G11C 16/26* (2013.01); *G06F 3/0604* (2013.01); *G06F 3/0659* (2013.01); *G06F 3/0679* (2013.01); *G11C 11/5642* (2013.01); *G11C 11/5671* (2013.01); *G11C 16/0483* (2013.01); *G11C 29/52* (2013.01)

(58) Field of Classification Search
CPC . G11C 16/26; G11C 16/0483; G11C 11/5642; G11C 11/5671; G11C 29/52; G11C 2029/0409; G11C 2029/0411; G06F 3/0604; G06F 3/0659; G06F 3/0679; G06F 11/1012
See application file for complete search history.

(56) References Cited

U.S. PATENT DOCUMENTS 9,715,429 B1    7/2017  Lin
10,482,978 B2 * 11/2019  Hsiao .................. G11C 11/5642

FOREIGN PATENT DOCUMENTS

KR      10-1516577      5/2015

* cited by examiner

*Primary Examiner* — David Lam
(74) *Attorney, Agent, or Firm* — IP & T Group LLP

(57) ABSTRACT

An operating method of controller includes estimating, by a mean-bias manager, candidates of a mean bias voltage based on source read voltages corresponding to respective program states; determining, by a reliability interval manager, whether the candidates of the mean bias voltage are within confidence intervals respectively corresponding to the program states; selecting, by the reliability interval manager, the candidates of the mean bias voltage when the candidates of the mean bias voltage are within confidence intervals, respectively; deciding, by a read bias manager, target read voltages based on selected mean bias voltages or the selected candidates of the mean bias voltage; and reading, by a processor, target data according to the target read voltages.

20 Claims, 13 Drawing Sheets

CONTROLLER AND OPERATING METHOD THEREOF

CROSS-REFERENCE TO RELATED APPLICATION

The present application claims priority under 35 U.S.C. § 119(a) to Korean Patent Application No. 10-2018-0097472, filed on Aug. 21, 2018, the disclosure of which is incorporated herein by reference in its entirety.

BACKGROUND

1. Field

Various embodiments of the present invention relate to a controller. Particularly, various embodiments relate to a controller capable of efficiently detecting optimal read bias, and an operating method thereof.

2. Description of the Related Art

The computer environment paradigm has moved towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory or an auxiliary memory of a portable electronic device.

Since there is no mechanical driving part, a data storage device using a memory device provides advantages such as excellent stability and durability, high information access speed, and low power consumption. Also, such data storage device can have a quick data access rate with low power consumption compared to a hard disk device. Non-limiting examples of the data storage device having such advantages include universal serial bus (USB) memory devices, memory cards of diverse interfaces, solid state drives (SSDs), and the like.

SUMMARY

Various embodiments of the present invention are directed to a memory system capable of efficiently detecting optimal read bias for improving a read operation.

In accordance with an embodiment of the present invention, an operating method of controller may include: estimating, by a mean-bias manager, candidates of a mean bias voltage based on source read voltages corresponding to respective program states; determining, by a reliability interval manager, whether the candidates of the mean bias voltage are within confidence intervals respectively corresponding to the program states; selecting, by the reliability interval manager, the candidates of the mean bias voltage when the candidates of the mean bias voltage are within confidence intervals, respectively; deciding, by a read bias manager, target read voltages based on selected mean bias voltages or the selected candidates of the mean bias voltage; and reading, by a processor, target data according to the target read voltages.

In accordance with an embodiment of the present invention, a controller may include: a mean-bias manager suitable for estimating candidates of a mean bias voltage based on source read voltages corresponding to respective program states; a reliability interval manager suitable for determining whether the candidates of the mean bias voltage are within confidence intervals respectively corresponding to the program states, and selecting the candidates of the mean bias voltage when the candidates of the mean bias voltage are within confidence intervals, respectively; a read bias manager suitable for deciding target read voltages based on selected mean bias voltages or the selected candidates of the mean bias voltage; and a processor suitable for reading target data according to the target read voltages.

In accordance with an embodiment of the present invention, a memory system may include: a memory device: and a controller suitable for controlling the memory device to read data stored therein, wherein the controller is suitable for: estimating mean bias voltages based on source read voltages corresponding to respective program states; determining whether the mean bias voltages are within set intervals respectively corresponding to the program states; when it is determined that the mean bias voltages are within the corresponding set intervals, determining target read voltages based on the mean bias voltages, respectively; reading target data from the memory device based on one of the target read voltages; and updating the target read voltages as the source read voltages.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
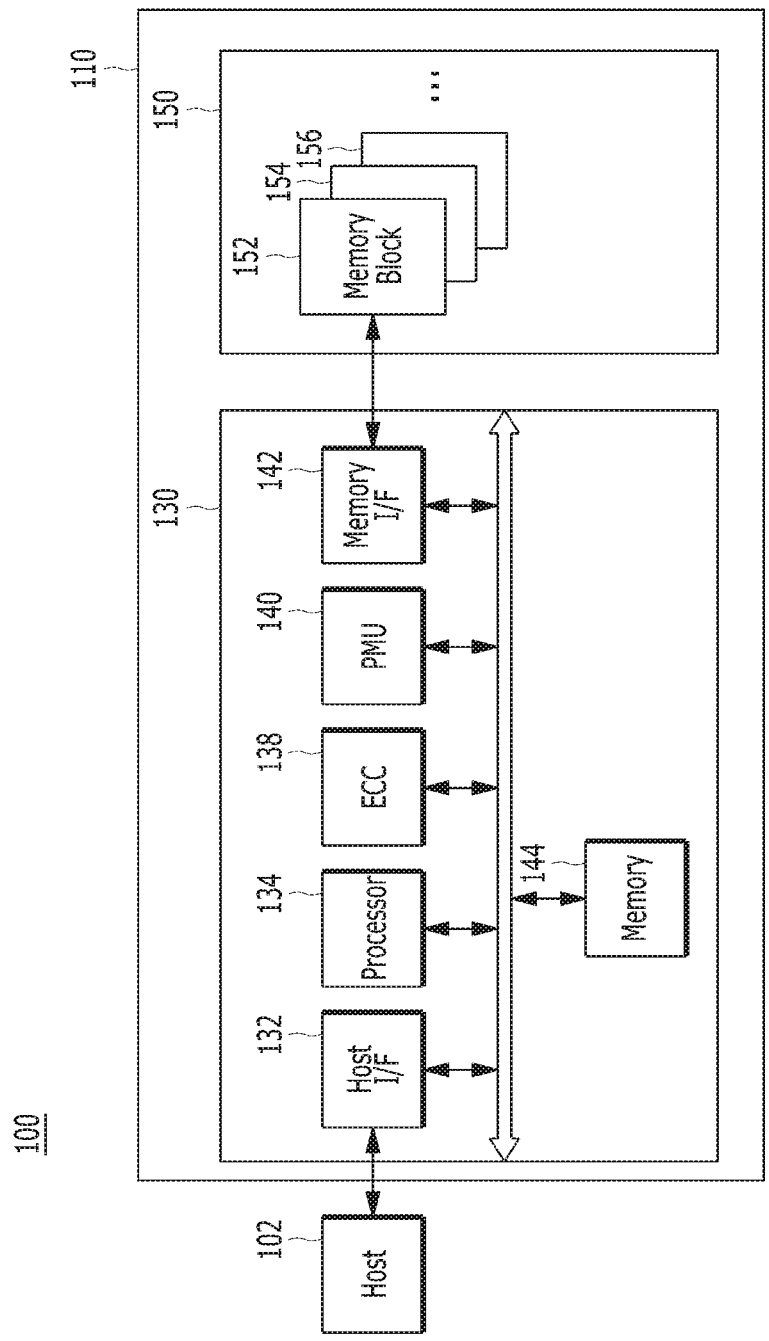
FIG. 1 is a block diagram illustrating a data processing system including a memory system in accordance with an embodiment of the present disclosure.

Various embodiments of the disclosure are described below in more detail with reference to the accompanying drawings. However, elements and features of the present invention may be configured or arranged to form other embodiments, which may be modifications or variations of any of the disclosed embodiments. Thus, the present invention is not limited to the embodiments set forth herein. Rather, the described embodiments are provided so that this disclosure is thorough and complete and fully conveys the present invention to those skilled in the art to which this invention pertains. Throughout the disclosure, like reference numerals refer to like parts throughout the various figures and examples of the disclosure. It is noted that reference to "an embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance may be termed a second or third element in another instance without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Whether two elements are directly or indirectly connected/coupled, communication between the two elements may be wired or wireless, unless stated or the context indicates otherwise.

The terminology used herein is for the purpose of describing particular embodiments and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, any of a variety of portable electronic devices such as a mobile phone, an MP3 player and a laptop computer or an electronic device such as a desktop computer, a game player, a television (TV), a projector, and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and/or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and/or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device that retains data stored therein even while an electrical power is not supplied. The memory device 150 may store data provided from the host 102 through a write operation, and provide data stored therein to the host 102 through a read operation. The memory device 150 may include a plurality of memory blocks 152 to 156, each of which may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, to the host 102, and/or may store the data, provided by the host 102, into the memory device 150.

The controller 130 may include a host interface (I/F) 132, a processor 134, an error correction code (ECC) component 138, a power management unit (PMU) 140, a memory interface (I/F) 142, and a memory 144, all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI), and integrated drive electronics (IDE).

The ECC component 138 may detect and correct errors in the data read from the memory device 150 during the read operation. When the number of the error bits is greater than or equal to a threshold number of correctable error bits, the ECC component 138 may not correct error bits but instead may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC component 138 may include all or some of circuits, modules, systems or devices for performing the error correction operation based on at least one of the above described codes.

The PMU 140 may provide and manage power of the controller 130.

The memory interface 142 may serve as an interface for handling commands and data, transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, when the memory device 150 is a flash memory and, in particular, a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. The memory 144 may be implemented with a static random access memory (SRAM) or a dynamic random access memory (DRAM). Although FIG. 1 shows the memory 144 disposed within the controller 130, the disclosure is not limited thereto. That is, the memory 144 may be located within or externally to the controller 130. For instance, the memory 144 may be embodied by an external volatile memory having a memory interface transferring data and/or signals between the memory 144 and the controller 130.

The processor 134 may control the overall operations of the memory system 110. The processor 134 may drive or execute firmware to control the overall operations of the memory system 110. The firmware may be referred to as a flash translation layer (FTL).

An FTL may perform an operation as an interface between the host 102 and the memory device 150. The host 102 may transmit requests for write and read operations to the memory device 150 through the FTL.

The FTL may manage operations of address mapping, garbage collection, wear-leveling and the like. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may significantly reduce the utilization efficiency of the memory device 150 having a 3D stack structure and the reliability of the memory system 100, and thus reliable bad block management is required.

Figure 2:
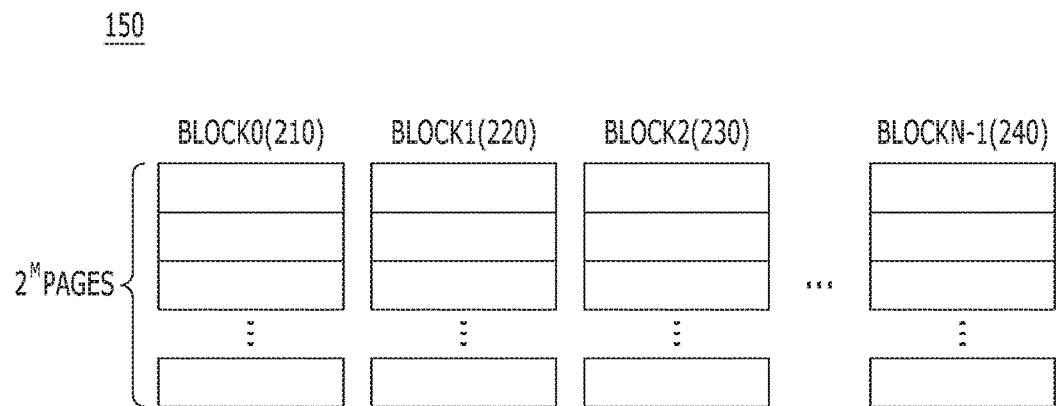
FIG. 2 is a schematic diagram illustrating a memory device of a memory system in accordance with an embodiment of the present disclosure.

FIG. 2 is a schematic diagram illustrating a memory device, e.g., the memory device 150 of FIG. 1, in accordance with an embodiment of the present disclosure.

Referring to FIG. 2, the memory device 150 may include the plurality of memory blocks BLOCK0 210 to BLOCKN-1 240, and each such block may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
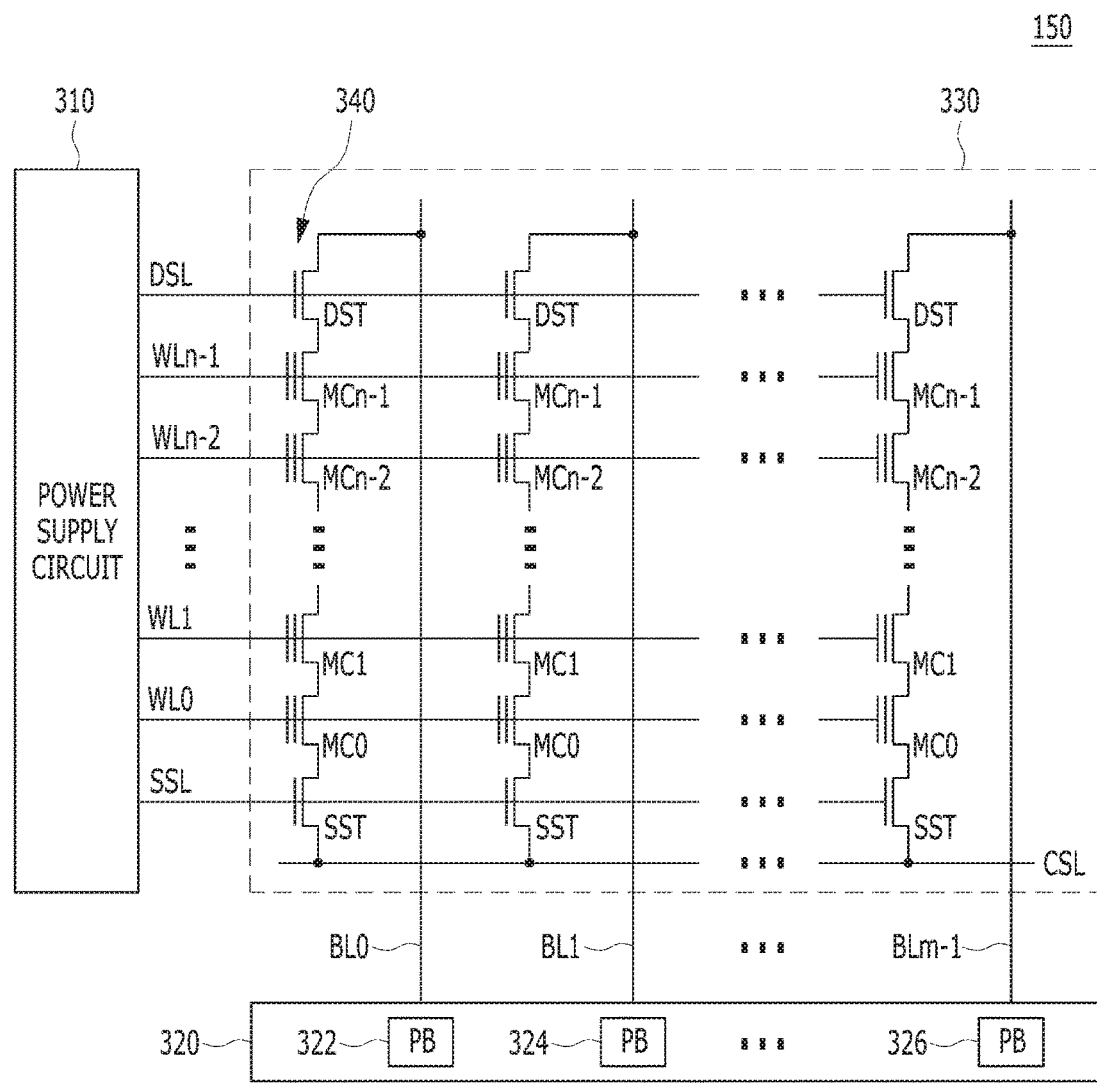
FIG. 3 is a circuit diagram illustrating a memory cell array of a memory block in a memory device in accordance with an embodiment of the present disclosure.

FIG. 3 is a circuit diagram illustrating a memory block 330 in the memory device 150 in accordance with an embodiment of the present disclosure.

Referring to FIG. 3, the memory block 330 may correspond to any of the plurality of memory blocks 152 to 156 in the memory device 150 of the memory system 110.

The memory block 330 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured as single level cells (SLC) each of which may store 1 bit of information, or as multi-level cells (MLC) each of which may store a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, that the memory block 330 is constituted with NAND flash memory cells, it is to be noted that the memory block 330 of the memory device 150 is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may supply word line voltages, for example, a program voltage, a read voltage and a pass voltage, to respective word lines according to an operation mode, as well as supply voltages to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
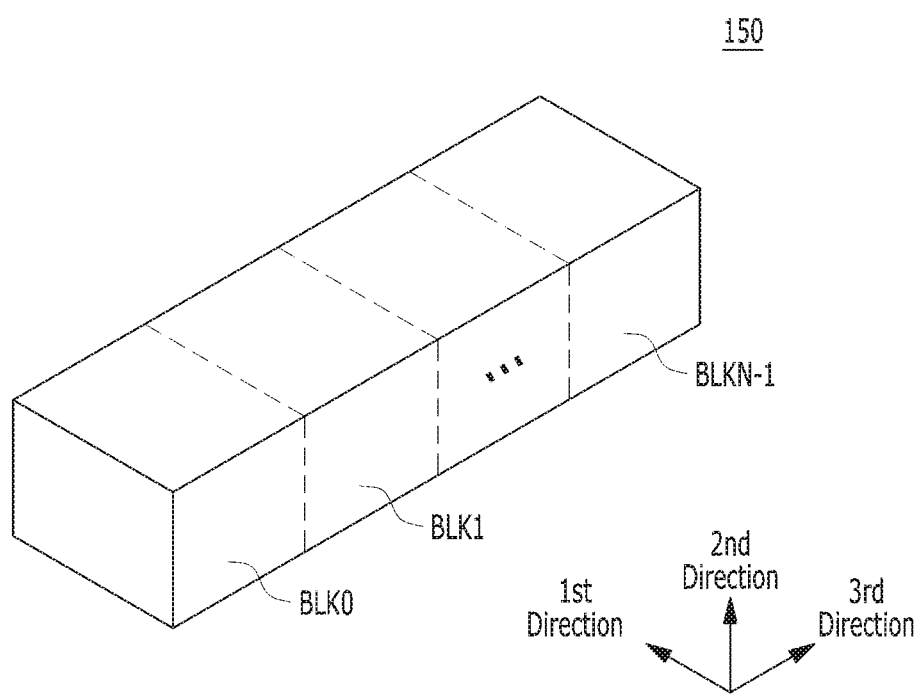
FIG. 4 is a schematic diagram illustrating a three-dimensional structure of a memory device in accordance with an embodiment of the present disclosure.

FIG. 4 is a schematic diagram illustrating a three-dimensional (3D) structure of a memory device, e.g., the memory device 150, in accordance with an embodiment of the present disclosure.

Specifically, as illustrated in FIG. 4, the memory device 150 may be embodied in a nonvolatile memory device having a 3D stack structure. When the memory device 150 has a 3D structure, the memory device 150 may include a plurality of memory blocks BLK0 to BLKN-1 each having a 3D structure (or a vertical structure). As an alternative to the 3D structure shown in FIG. 3, the memory device 150 may be configured as a two-dimensional (2D) structure.

In a nonvolatile memory such as a flash memory, different quantities of data may be stored in each memory cell depending on the type of memory cell. A single level cell (SLC) or a single bit cell may store 1-bit data in a single memory cell. A multi-level cell (MLC), a multi-bit cell or a multi-state cell may store 2-bit data in a single memory cell. A triple level cell (TLC) may store 3-bit data in a single memory cell. The MLC and TLC have an advantage of memory integration. However, the MLC and TLC have drawback of lowered reliability and increased read failure rate, which become more serious as a number of bits to be programmed into a single memory cell becomes greater.

When k-bit data for example is to be programmed into a single memory cell, the memory cell may have one among $2^k$ number of threshold voltages. Due to minute differences of electrical characteristics among plural memory cells, threshold voltage distributions may be formed to have respective ranges by the threshold voltages of the memory cells, into which data of the same value is programmed. Respective threshold voltage distributions correspond to the respective $2^k$ number of data values that can be generated by the k-bit data.

However, a voltage window in which the threshold voltage distributions are formed is limited. Therefore, as the value of k becomes greater, distance between neighboring threshold voltage distributions becomes shorter and the neighboring threshold voltage distributions may overlap each other. As the neighboring threshold voltage distributions overlap each other, read data may include a high number of errors (for example, several or even dozens of error bits).

Figure 5A:
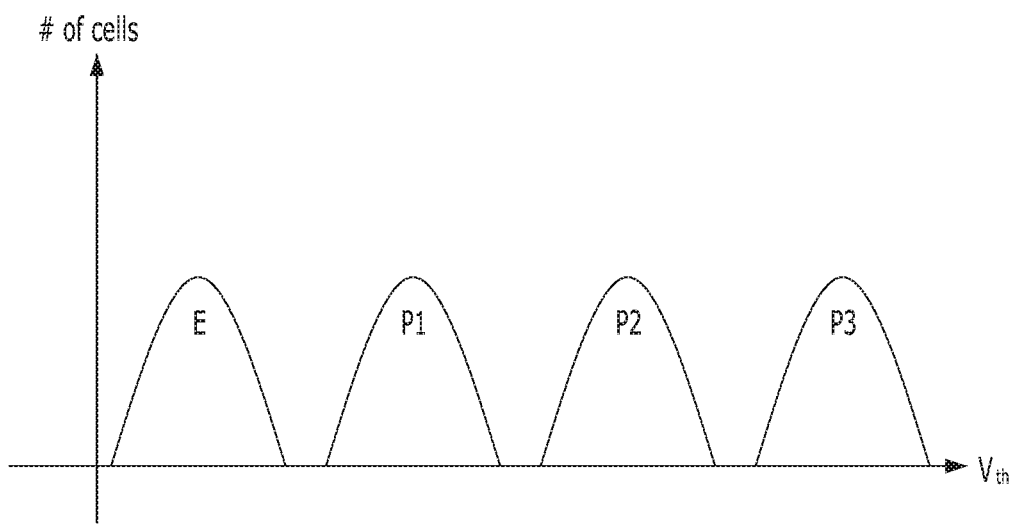
FIG. 5A is a graph illustrating a threshold voltage distribution representing ideal program and erase states of a 2-bit multi-level cell (MLC) nonvolatile memory device.

FIG. 5A is a graph illustrating a threshold voltage distribution representing ideal program and erase states of a 2-bit multi-level cell (MLC) nonvolatile memory device.

Figure 5B:
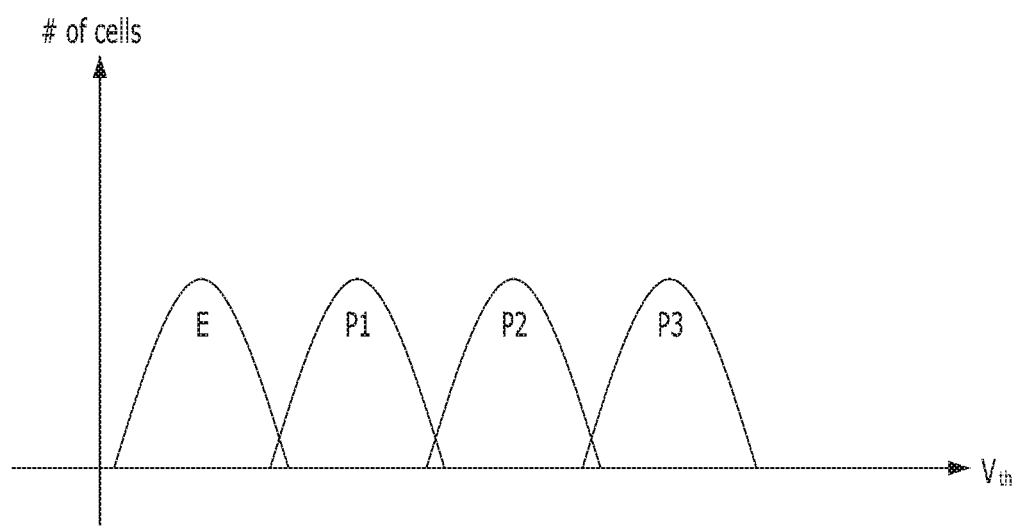
FIG. 5B is a graph illustrating a threshold voltage distribution representing program and erase states that may be distorted due to characteristics deterioration of a 2-bit multi-level cell (MLC) nonvolatile memory device.

FIG. 5B is a graph illustrating a threshold voltage distribution representing program and erase states that may be distorted due to characteristics deterioration of the 2-bit multi-level cell (MLC) nonvolatile memory device.

When two-bit data (i.e., k=2) is programmed into a single memory cell of MLC nonvolatile memory device, for example, an MLC flash memory device, one among four (i.e., $2^k$=4) threshold voltage distributions may be formed on the memory cell.

Due to minute differences of electrical characteristics among plural memory cells, threshold voltage distributions may be formed to have respective ranges by the threshold voltages of the memory cells, into which data of the same value is programmed. In the case of 2-bit MLCs, threshold voltage distributions of four program states (P1 to P3) and a single erase state (E) may be formed on the 2-bit MLCs. FIG. 5A shows ideal threshold voltage distributions, which do not overlap each other and each of which has a read voltage margin of a certain range.

Referring to FIG. 5B, in the case of the flash memory device, there may occur charge loss as time flies. During the charge loss, electrons trapped in the floating gate or the tunnel oxide are emitted. The charge loss may become serious due to deterioration of the tunnel oxide as the program operation and the erase operation are repeated. The charge loss may lower a level of the threshold voltage. For example, the threshold voltage distributions may move in a leftward direction.

Further, one or more among the program disturbance, the erase disturbance and the back-pattern dependency may widen the threshold voltage distribution. Therefore, due to the characteristics deterioration of the memory cells by the phenomenon described above, neighboring threshold voltage distributions (i.e., E and P1 to P3) may overlap each other as illustrated in FIG. 5B.

As the threshold voltage distributions overlap each other, read data may have a large number of errors. Further, as the threshold voltage distributions overlap each other, read data may have a large number of error bits.

To solve the above-mentioned phenomenon, an error correction code (ECC) may be used in general. As the error correction code, the Polar Code, the Bose-Chaudhuri-Hocquenghem (BCH) code and so forth may be used. Particularly, the low density parity check (LDPC) having a great error correction capability may be used. An error correction operation through the LDPC code may use soft decision information (e.g., the log likelihood ratio (LLR) information), in which weight of reliability is reflected, instead of hard decision information (e.g., binary information), in order to correct an error. Erroneous LLR information may degrade the error-correction performance of the LDPC code. The LLR information may be obtained by a plurality of read voltages and an optimal LLR information may be optimized by an optimal read voltage. The optimal LLR information may lead the LDPC code to have an optimal error-correction performance. When the optimal read voltage is determined fast and precisely, the error-correction performance and data-read performance of a memory system may improve.

In accordance with an embodiment of the present invention, the memory system 110 may determine an optimal read voltage by utilizing the fact that the threshold voltage distributions of program states shift in just one direction, i.e., either left or right, without great change of width of the voltage window even under stress to the threshold voltage distributions of program states in the memory system 110.

Figure 6:
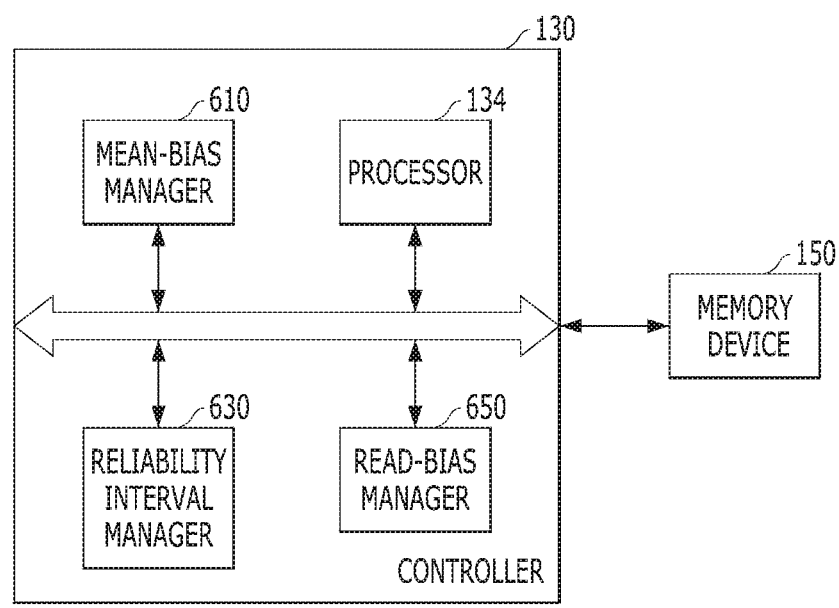
FIG. 6 is a schematic diagram illustrating a memory system in accordance with an embodiment of the present disclosure.

FIG. 6 is a schematic diagram illustrating a memory system 110 in accordance with an embodiment of the present invention. For clarity, FIG. 6 shows select elements relating to an embodiment of the present invention, as compared with the structure of the memory system 110 illustrated in FIG. 1, where more elements are shown.

FIGS. 7A to 7D schematically show an operation of deciding a read voltage in accordance with an embodiment of the present invention.

Figure 7A:
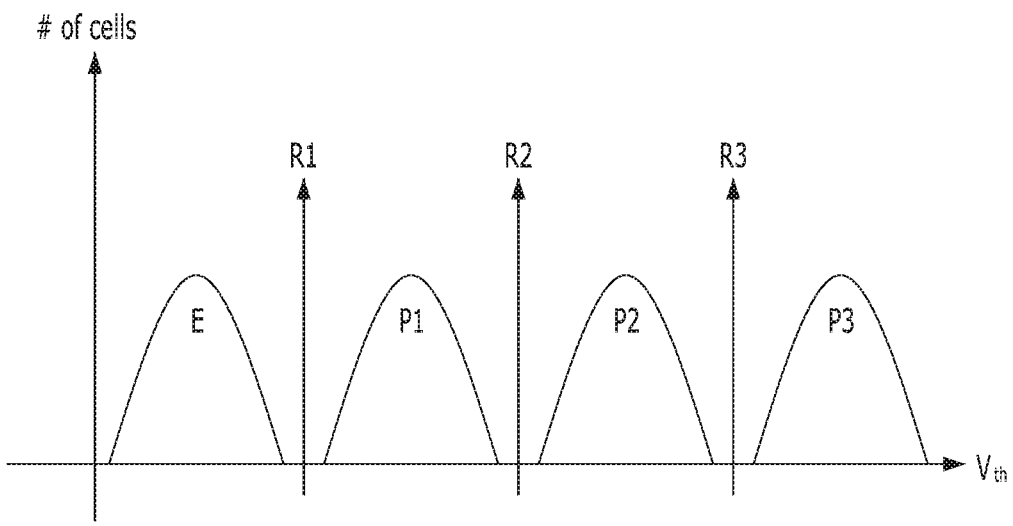
FIGS. 7A to 7D schematically show an operation of deciding a read voltage in accordance with an embodiment of the present disclosure.
Figure 7B:
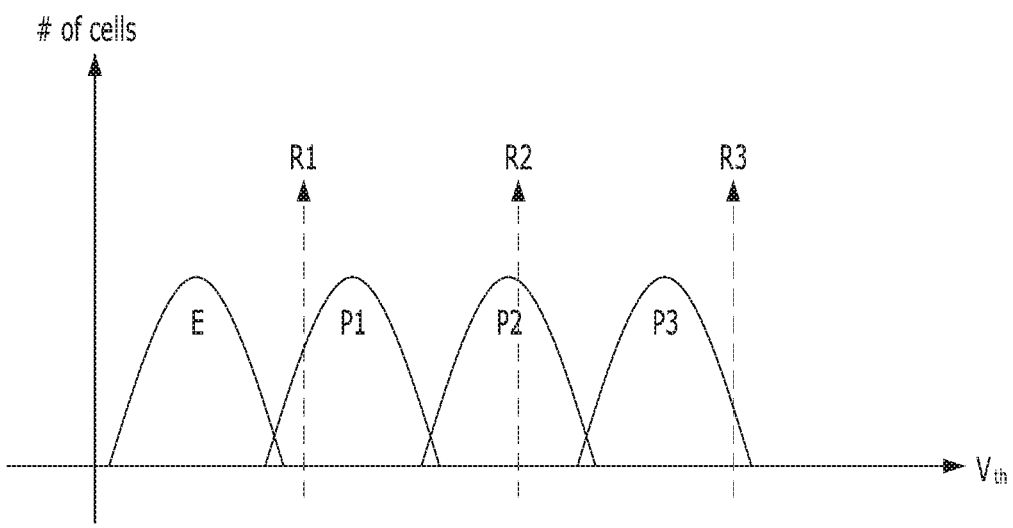
Figure 7C:
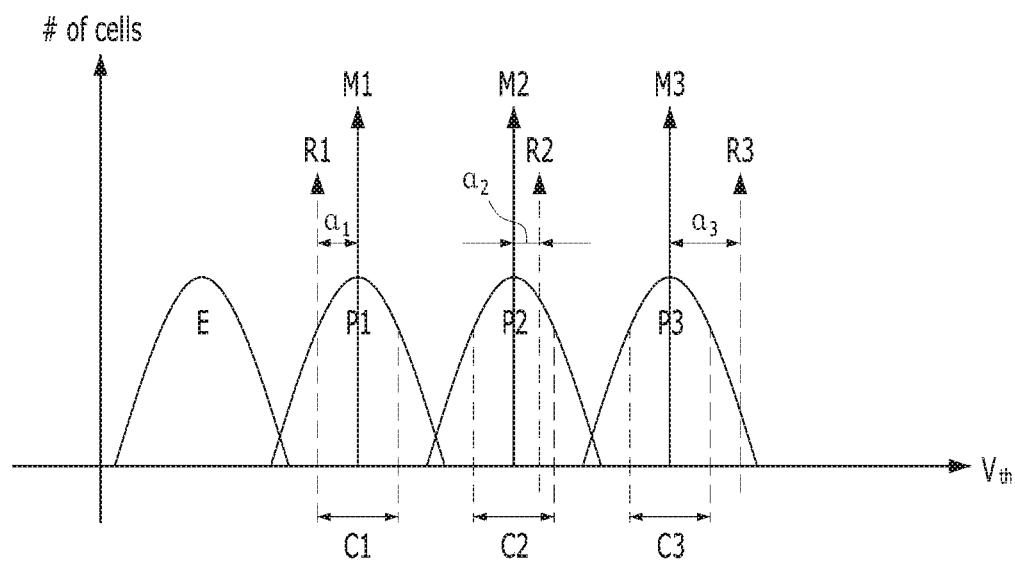
Figure 7D:
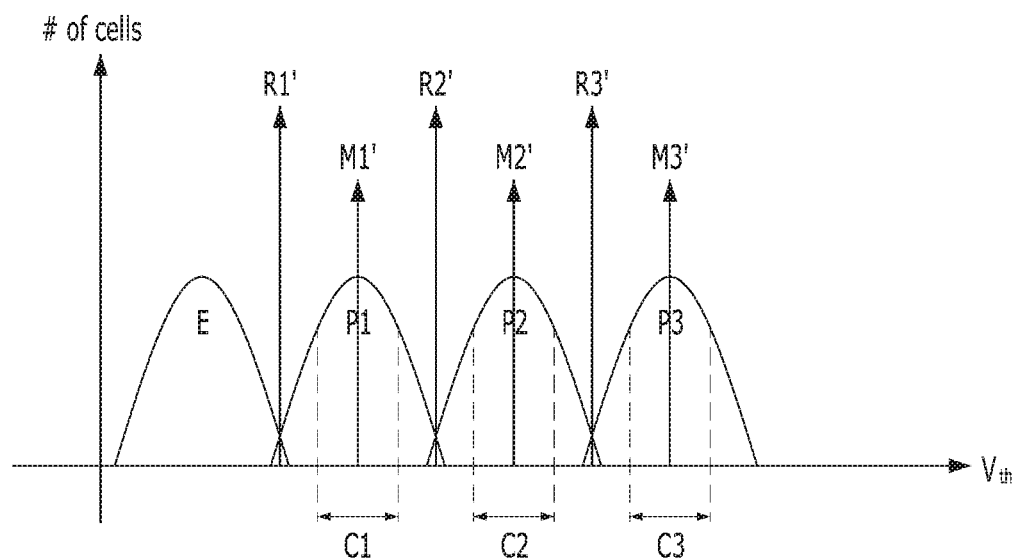

With reference to FIGS. 6 to 7D a structure and an operation of the memory system 110 in accordance with an embodiment of the present invention are described.

As described with reference to FIG. 1, the memory system 110 may include the memory device 150 and the controller 130 configured to control the memory device 150. In the context of the description below, the memory device 150 is an MLC memory device. However, this is merely an example and the present invention is not limited thereto. As noted above, the memory device 150 may be of another type.

The processor 134 of the controller 130 may control the memory device 150 to read data stored in the memory device 150. The voltage supply circuit 310 may provide the memory cell array 330 with read voltages to read data stored in the memory cell array 330 under the control of the processor 134. In an initial phase, the processor 134 may control the memory device 150 to read data using a read voltage having a default value. The read voltage having the default value may be an optimal read voltage.

For example, referring to FIGS. 7A and 7B, the processor 134 may control the memory device 150 to read data using a plurality of read voltages R1 to R3, which may have set default values. The plurality of read voltages R1 to R3 may be optimal read voltages for the memory device 150 having the threshold voltage distributions of program states. However, as mentioned with reference to FIG. 5B, the threshold voltage distributions of program states may be deformed in the memory device 150 as illustrated in FIG. 7B. In this case, when the processor 134 controls the memory device 150 to read data using the plurality of read voltages R1 to R3 having the default values, the read operation may fail, which indicates that the optimal read voltage should be changed according to the threshold voltage distributions of program states. Therefore, the controller 130 may determine another optimal read voltage (a target read voltage), which is different from a previous optimal read voltage (a source read voltage).

The controller 130 may further include, in order to decide a target read voltage, a mean-bias manager 610, a reliability interval manager 630 and a read bias manager 650. Although the mean-bias manager 610, the reliability interval manager 630 and the read bias manager 650 are illustrated as provided externally to the processor 134, any or all of these components may be included within the processor 134.

The mean-bias manager 610 may manage information about candidates of a mean bias voltage. The mean bias voltage may refer to a voltage, according to which data can be read from a greatest number of memory cells in a single voltage window. In an ideal case, the mean bias voltage may have a level right in the middle of a single voltage window. A threshold voltage distribution of a single program state may correspond to a single mean bias voltage. For example, referring to FIG. 7A, each of the threshold voltage distributions of the program states P1 to P3 corresponds to a single mean bias voltage and the respective threshold voltage distributions of the program states P1 to P3 represent three mean bias voltages in total. When the threshold voltage distributions of the program states P1 to P3 are deformed due to stress, the mean bias voltages may also change.

Referring to FIGS. 6 and 7C, the mean-bias manager 610 may estimate candidates M1 to M3 of the mean bias voltage by adding constants $\alpha_1$ to $\alpha_3$ to the source read voltages R1 to R3, respectively. The source read voltages R1 to R3 may refer to the optimal read voltages, according to which read operations are successful before the deformation of the threshold voltage distributions of the program states P1 to P3.

The constants $\alpha_1$ to $\alpha_3$ may be obtained by utilizing the source read voltages R1 to R3. The controller 130 may identify each size of the plurality of pages included in the memory device 150. Therefore, the number of memory cells included in each of the plurality of pages may be obtained. The number of cells having a high logic level, i.e., "1" cells, read as a value of "1" using the ideal mean bias voltage may be obtained. "1" cell indicates a memory cell read as a value of "1" using a bias voltage. The number of "1" cells read using the source read voltages R1 to R3 may be obtained. The mean-bias manager 610 may obtain the constants $\alpha_1$ to $\alpha_3$ by multiplying the reciprocal of the width of a single voltage window and the difference between the number of "1" cells read using the source read voltages R1 to R3 and the number of "1" cells read using to the ideal mean bias voltage for a total number of "1" cells within the single voltage window.

For example, a number of memory cells included in each of the plurality of pages is 400 and the width of the single voltage window is 10. The number of "1" cells within the single voltage window may be 100. The number of "1" cells read according to a read voltage having a level in the middle of the threshold voltage distribution of the erase state (E) may be 50. The number of "1" cells read according to an ideal first mean bias voltage having a level in the middle of the threshold voltage distribution of the first program state (P1) may be 150. The number of "1" cells read according to an ideal second mean bias voltage having a level in the middle of the threshold voltage distribution of the second program state (P2) may be 250. The number of "1" cells read according to an ideal third mean bias voltage having a level in the middle of the threshold voltage distribution of the third program state (P3) may be 350. When the number of "1" cells read according to the first source read voltage is 130, the constant may be 2 according to the above-described scheme.

In another embodiment, the mean-bias manager 610 may estimate the candidates M1 to M3 of the mean bias voltage according to the gaussian modelling (GM) algorithm.

For example, the mean-bias manager 610 may obtain a third candidate M3 of the mean bias voltage corresponding to the threshold voltage distribution of the third program state according to the gaussian modelling algorithm. The gaussian normal distribution may be determined by an average and a variance. Therefore, the mean-bias manager 610 may estimate the third candidate M3 of the mean bias voltage corresponding to the threshold voltage distribution of the third program state according to the gaussian modelling algorithm when the gaussian normal distribution of the third program state is clear and the distribution is made into a constant. The mean-bias manager 610 may estimate the third candidate M3 of the mean bias voltage corresponding to the threshold voltage distribution of the third program state according to following equation 1 and equation 2.

$$\int_{R_3}^{\infty} \frac{1}{\sqrt{2\pi}\,\sigma} e^{\left(\frac{(x-m_3)^2}{2\sigma^2}\right)} dx = p_3 \quad \text{[Equation 1]}$$

$$m_3 = R_3 - \sigma \cdot Q^{-1}(p_3) \quad \text{[Equation 2]}$$

In equation 1 and equation 2, "$m_3$" may represent the third candidate M3 of the mean bias voltage corresponding to the threshold voltage distribution of the third program state and may indicate the average value of the normal distribution for the third program state. Also, "$\sigma$" may indicate the variance of the normal distribution for the third program state. "$R_3$" may represent the third source read voltage. "Q" may represent the q function.

The gaussian modelling algorithm is merely an example and the mean-bias manager 610 may estimate the candidates M1 to M3 of the mean bias voltage according to another algorithm.

The mean-bias manager 610 may estimate the candidates M1 to M3 of the mean bias voltage by utilizing the source read voltages R1 to R3 and the constants $\alpha_1$ to $\alpha_3$. Alternatively, the mean-bias manager 610 may estimate the candidates M1 to M3 of the mean bias voltage according to the gaussian modelling algorithm. The mean-bias manager 610 may provide the reliability interval manager 630 with the estimated candidates M1 to M3 of the mean bias voltage.

The reliability interval manager 630 may determine whether the candidates M1 to M3 of the mean bias voltage are within confidence intervals, respectively. The confidence interval is a voltage range in which falls a set number or percentage of "1" cells, which number or percentage is determined by a designer, compared with the number or percentage of "1" cells according to the ideal mean bias voltage. For example, suppose that the designer has designed a confidence interval in which the number of "1" cells is 80 percent of the number of "1" cells according to the ideal mean bias voltage. When the number of "1" cells is '100' according to the ideal mean bias voltage, the number of "1" cells in the confidence interval may be '80'. The confidence intervals C1 to C3 may correspond to a plurality of program states, respectively. The ideal mean bias voltage may change according to the situation of the memory device 150 and thus the confidence intervals C1 to C3 may also change.

When any one among the estimated candidates M1 to M3 of the mean bias voltage is out of the confidence intervals C1 to C3, respectively, the reliability interval manager 630 may request the mean-bias manager 610 to re-estimate the candidate of the mean bias voltage, which is out of the confidence intervals C1 to C3. The mean-bias manager 610 may re-estimate the candidate of the mean bias voltage, which is out of the confidence intervals C1 to C3, according to the gaussian modelling algorithm.

When all the estimated candidates M1 to M3 of the mean bias voltage are within the confidence intervals C1 to C3, the reliability interval manager 630 may select the estimated candidates M1 to M3 of the mean bias voltage. The reliability interval manager 630 may provide the read bias manager 650 with the reliable selected mean bias voltages M1' to M3'.

Referring to FIGS. 6 to 7D, the read bias manager 650 may decide the target read voltages R1' to R3' based on the selected mean bias voltages M1' to M3'. The read bias manager 650 may decide, as the target read voltages R1' to R3', the read voltages having intermediate values of the selected mean bias voltages M1' to M3'. For example, the read bias manager 650 may decide, as the second target read voltage R2', the read voltage having an intermediate value between the first selected mean bias voltage M1' corresponding to the first program state and the second selected mean bias voltage M2' corresponding to the second program state. Also, the read bias manager 650 may decide, as the third target read voltage R3', the read voltage having an intermediate value between the second selected mean bias voltage M2' corresponding to the second program state and the third selected mean bias voltage M3' corresponding to the third program state. The read bias manager 650 may decide the first target read voltage R1' by utilizing the first selected mean bias voltage M1' and the difference between the second target read voltage R2' and the first selected mean bias voltage M1'.

The read bias manager 650 may provide the processor 134 with the decided target read voltages R1' to R3'.

The processor 134 may control the memory device 150 to read data according to the provided target read voltages R1' to R3'.

Over time, the program states may be shifted and thus, when the processor 134 controls the memory device 150 to read data according to the provided target read voltages R1' to R3', the read operation may fail. In this case, in accordance with an embodiment of the present invention, the memory system 110 may decide new target read voltages through the method described above. That is, the read bias manager 650 may update the target read voltages R1' to R3' to the source read voltages R1 to R3 and the controller 130 may decide new target read voltages through the method of deciding the target read voltages as described above.

In accordance with an embodiment of the present invention as described above, the controller 130 may decide the optimal read voltage rapidly and efficiently.

Figure 8:
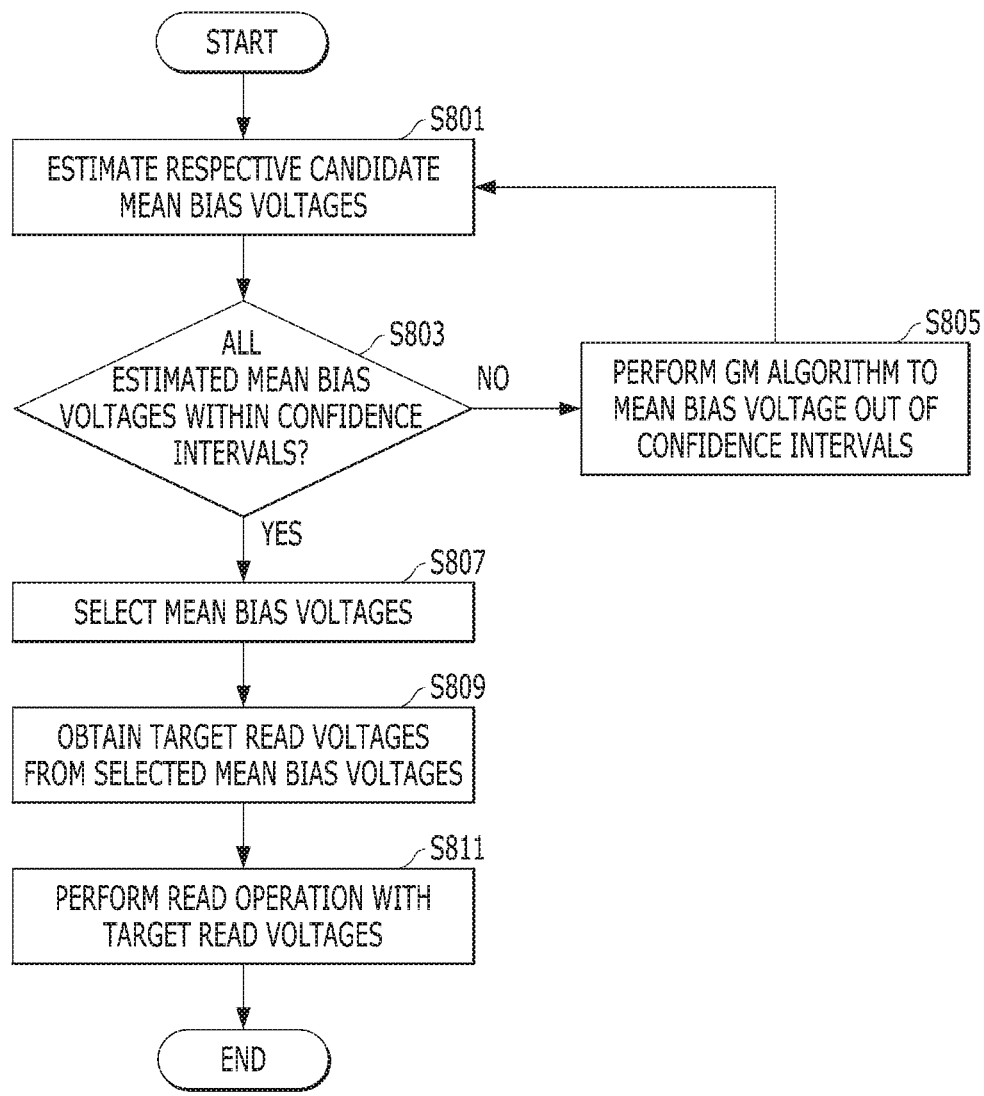
FIG. 8 is a flowchart illustrating an operation of a controller in accordance with an embodiment of the present disclosure.

FIG. 8 is a flowchart illustrating an operation of a controller, e.g., the controller 130, in accordance with an embodiment of the present invention. FIG. 8 exemplifies a situation in which the controller 130 decides or determines new read voltages after first experiencing failure of a read operation. In the context of the present description, the memory device 150 is an MLC memory device, which is merely an example. The present invention is not limited thereto.

Referring to FIG. 8, at step S801, the mean-bias manager 610 may estimate a plurality of candidates of the mean bias voltage, respectively, by utilizing a plurality of source read voltages and constants different from one another. The mean-bias manager 610 may provide the reliability interval manager 630 with the estimated candidates of the mean bias voltage.

At step S803, the reliability interval manager 630 may determine whether the plurality of estimated candidates of the mean bias voltage are within confidence intervals, respectively.

When any one among the estimated candidates of the mean bias voltage is out of its confidence interval ("NO" at step S803), the reliable interval manager 630 may provide the candidate of the mean bias voltage, which is out of its confidence interval back to the mean-bias manager 610. At step S805, the mean-bias manager 610 may re-estimate the candidate of the mean bias voltage, which is out of the corresponding confidence interval according to the gaussian modelling (GM) algorithm.

When all the estimated candidates of the mean bias voltage are within their respective confidence intervals ("YES" at step S803), the reliability interval manager 630 may select the plurality of estimated candidates of the mean bias voltage at step S807. The reliability interval manager 630 may provide the read bias manager 650 with the selected mean bias voltages.

At step S809, the read bias manager 650 may decide a plurality of target read voltages based on the plurality of selected mean bias voltages. The read bias manager 650 may provide the processor 134 with the decided target read voltages.

At step S811, the processor 134 may perform a read operation by utilizing the provided target read voltages. The processor 134 may control the memory device 150 to read data according to the provided target read voltages.

A data processing system and electronic devices which may be constituted with the memory system 110 including the memory device 150 and the controller 130, which are described above with reference to FIGS. 1 to 8, are described in detail below with reference to FIGS. 9 to 17.

FIGS. 9 to 17 are diagrams schematically illustrating exemplary applications of the data processing system of FIGS. 1 to 8 according to various embodiments.

Figure 9:
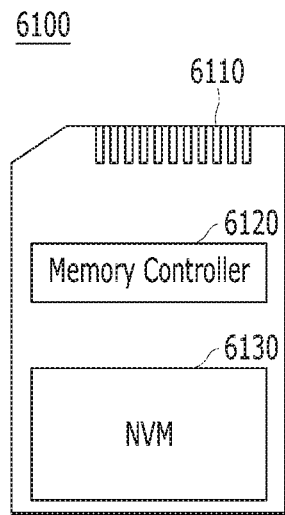
FIGS. 9 to 17 are schematic diagrams illustrating exemplary applications of a data processing system, in accordance with various embodiments of the present invention.

FIG. 9 is a diagram schematically illustrating an example of the data processing system including the memory system in accordance with an embodiment. FIG. 9 schematically illustrates a memory card system 6100 to which the memory system may be applied.

Referring to FIG. 9, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By the way of example but not limitation, the memory controller 6120 may be configured to control read, write, erase and background operations on the memory device 6130. The memory controller 6120 may be configured to provide an interface between the memory device 6130 and a host (not shown) and/or drive firmware for controlling the memory device 6130. That is, the memory controller 6120 may correspond to the controller 130 in the memory system 110 described with reference to FIGS. 1 to 8, while the memory device 6130 may correspond to the memory device 150 described with reference to FIGS. 1 to 8.

Thus, as shown in FIG. 1, the memory controller 6120 may include a random access memory (RAM), a processor, a host interface, a memory interface and an error correction component. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi), and Bluetooth. Thus, the memory system and the data processing system may be applied to wired and/or wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may be so integrated to form a solid state drive (SSD). Also, the memory controller 6120 and the memory device 6130 may be so integrated to form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC), and/or a universal flash storage (UFS).

Figure 10:
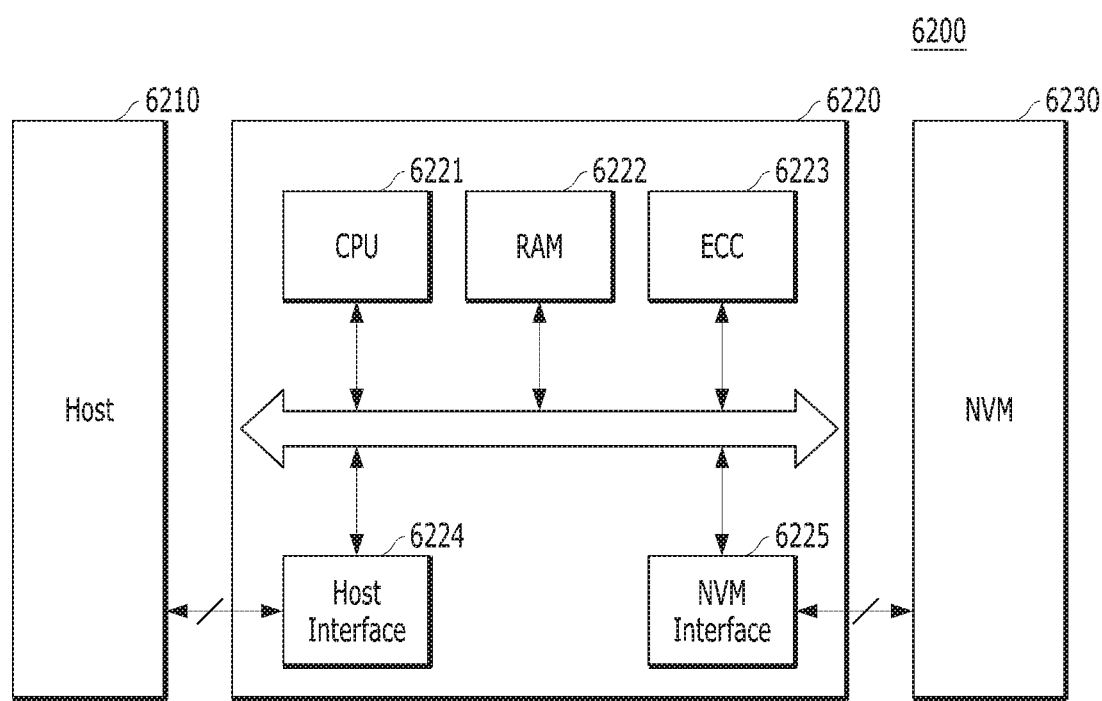

FIG. 10 is a diagram schematically illustrating another example of a data processing system 6200, including a memory system, in accordance with an embodiment.

Referring to FIG. 10, the data processing system 6200 may include a memory device 6230 having one or more nonvolatile memories (NVMs) and a memory controller 6220 for controlling the memory device 6230. The data processing system 6200 may serve as a storage medium such as a memory card (e.g., CF, SD, micro-SD or the like) or USB device, as described with reference to FIG. 1. The memory device 6230 may correspond to the memory device 150 in the memory system 110 described in FIGS. 1 to 8, and the memory controller 6220 may correspond to the controller 130 in the memory system 110 described in FIGS. 1 to 8.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. In this case, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may exchange data or signals with the host 6210 through the host interface 6224, and may exchange data or signals with the memory device 6230 through the NVM interface 6225. The host interface 6224 may be connected to the host 6210 through a parallel advanced technology attachment (DATA) bus, a serial advanced technology attachment (SATA) bus, a small computer system interface (SCSI), a universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then exchange data with the external device. As the memory controller 6220 is configured to communicate with the external device through one or more of various communication protocols, the memory system and the data processing system may be applied to wired and/or wireless electronic devices, particularly a mobile electronic device.

Figure 11:
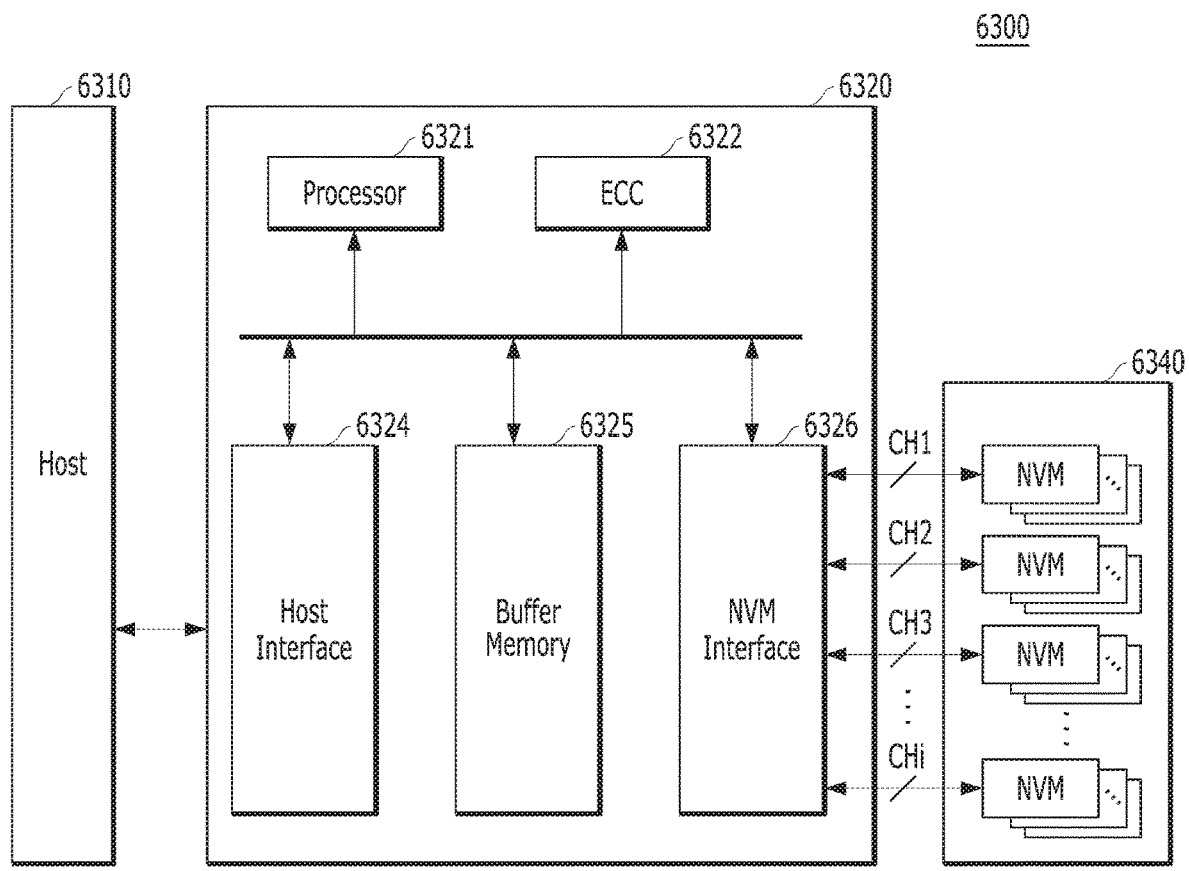

FIG. 11 is a diagram schematically illustrating another example of the data processing system including the memory system in accordance with an embodiment. FIG. 11 schematically illustrates a solid state drive (SSD) 6300 to which the memory system may be applied.

Referring to FIG. 11, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by any of various volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 11 illustrates that the buffer memory 6325 is disposed in the controller 6320, but the buffer memory 6325 may be external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
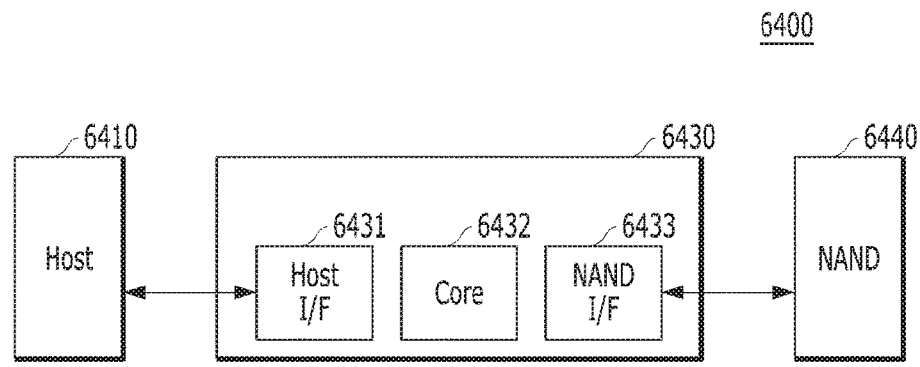

FIG. 12 is a diagram schematically illustrating another example of the data processing system including the memory system in accordance with an embodiment. FIG. 12 schematically illustrates an embedded Multi-Media Card (eMMC) 6400 to which the memory system may be applied.

Referring to FIG. 12, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I or UHS-II interface.

FIGS. 13 to 17 are diagrams schematically illustrating other examples of the data processing system including the memory system in accordance with embodiments. FIGS. 14 to 17 schematically illustrate universal flash storage (UFS) systems to which the memory system may be applied.

Referring to FIGS. 13 to 17, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices or particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices or particularly mobile electronic devices through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 13:
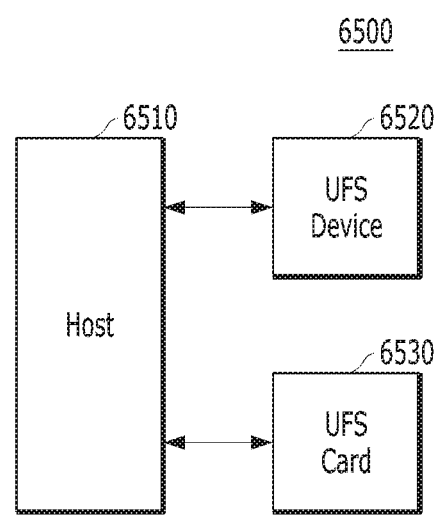

In the UFS system 6500 illustrated in FIG. 13, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. FIG. 13 illustrates, as an example, the configuration in which one UFS device 6520 and one UFS card 6530 are connected to the host 6510. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement that a single device is coupled with plural other devices or cards for centralized control.

Figure 14:
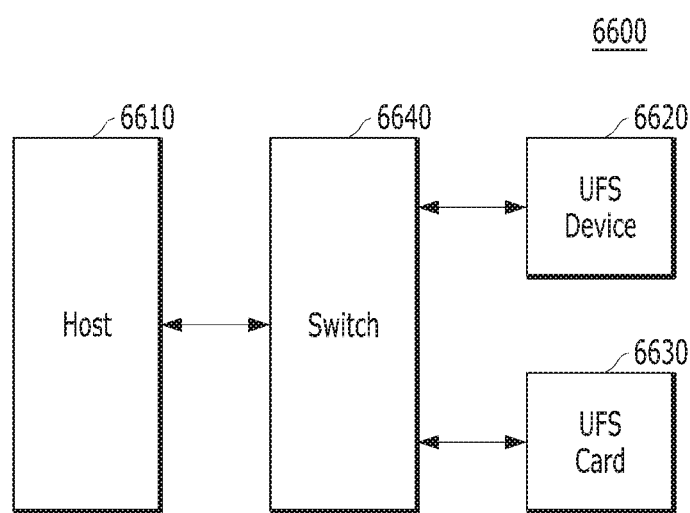

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. FIG. 14 illustrates, as an example, the configuration in which one UFS device 6620 and one UFS card 6630 are connected to the switching module 6640. However, a plurality of UFS devices and UFS cards may be connected in parallel or in the form of a star to the switching module 6640, and a plurality of UFS cards may be connected in series or in the form of a chain to the UFS device 6620.

Figure 15:
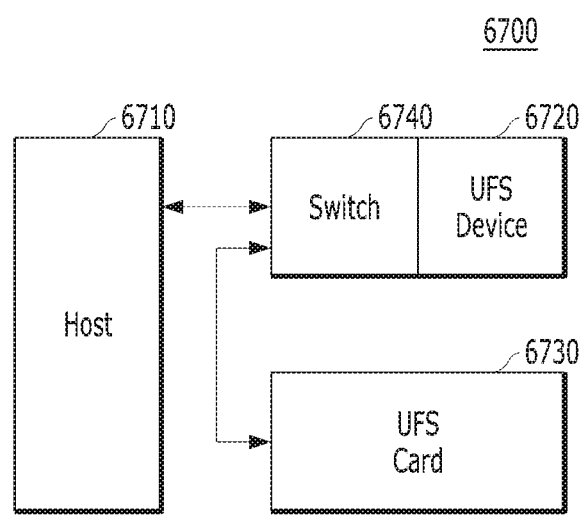

In the UFS system 6700 illustrated in FIG. 15, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. FIG. 15 illustrates, as an example, the configuration in which one UFS device 6720 and one UFS card 6730 are connected to the switching module 6740. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
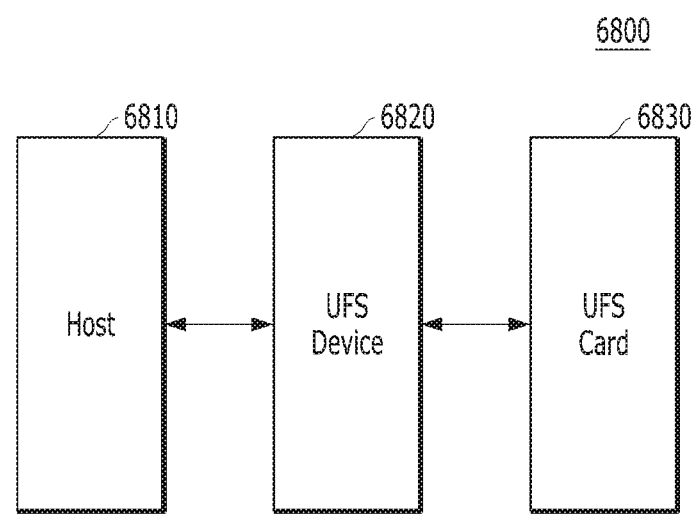

In the UFS system 6800 illustrated in FIG. 16, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. FIG. 16 illustrates an embodiment in which one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
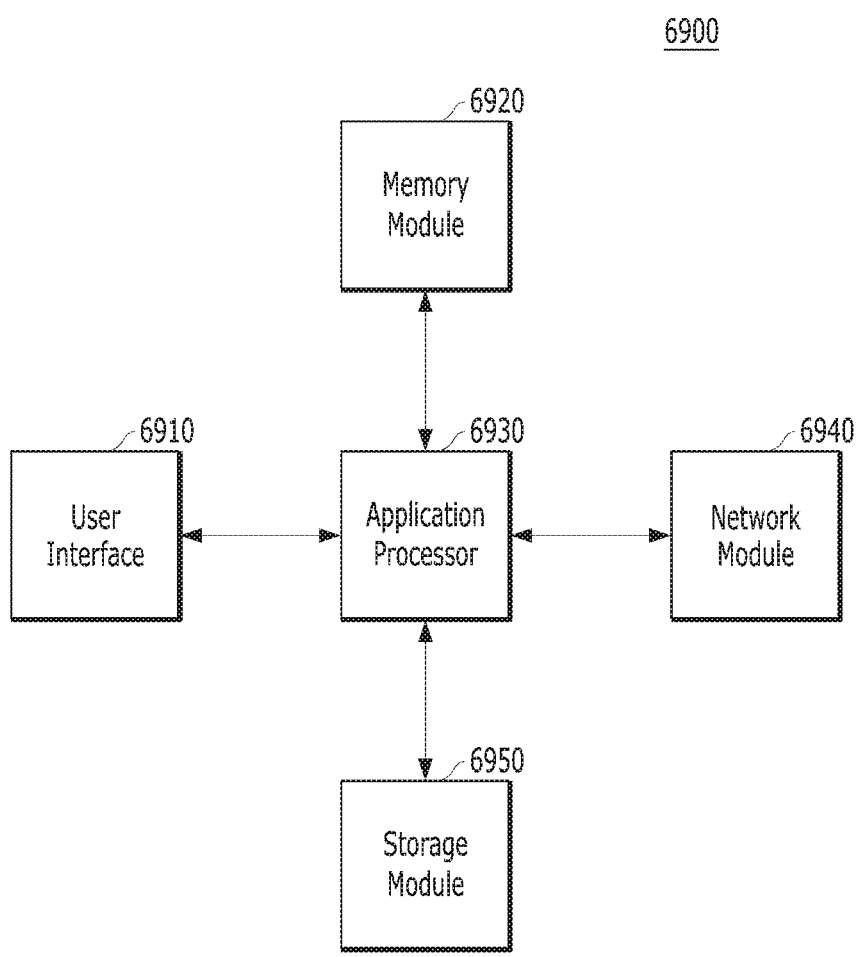

FIG. 17 is a diagram schematically illustrating another example of the data processing system including the memory system in accordance with an embodiment. FIG. 17 is a diagram schematically illustrating a user system 6900 to which the memory system may be applied.

Referring to FIG. 17, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDRAM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, the memory system and the data processing system can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been illustrated and described with respect to specific embodiments, it will be apparent to those skilled in the art in light of the present disclosure that various changes and modifications may be made without departing from the spirit and scope of the invention as determined in the following claims.

What is claimed is:

1. An operating method of a controller, the method comprising:
    estimating, by a mean-bias manager, candidates of a mean bias voltage based on source read voltages corresponding to respective program states;
    determining, by a reliability interval manager, whether the candidates of the mean bias voltage are within confidence intervals respectively corresponding to the program states;
    selecting, by the reliability interval manager, the candidates of the mean bias voltage when the candidates of the mean bias voltage are within confidence intervals, respectively;
    deciding, by a read bias manager, target read voltages based on selected mean bias voltages or the selected candidates of the mean bias voltage; and
    reading, by a processor, target data according to the target read voltages.

2. The method of claim 1, wherein the estimating of the candidates of the mean bias voltage includes estimating the candidates of the mean bias voltage by utilizing the source read voltages and respective constants thereof.

3. The method of claim 2, further comprising obtaining the constants by utilizing numbers of "1" cells according to the source read voltages, numbers of "1" cells according to ideal mean bias voltages corresponding to the program states and widths of voltage windows corresponding to the program states.

4. The method of claim 1, wherein the estimating of the candidates of the mean bias voltage includes estimating the candidates of the mean bias voltage by utilizing the source read voltages and a gaussian modelling algorithm.

5. The method of claim 1, wherein each of the confidence intervals is a voltage range having a set number of "1" cells relative to a number of "0" cells, or vice versa, according to ideal mean bias voltages.

6. The method of claim 1, wherein the deciding of the target read voltages includes deciding, as the target read voltages, read voltages having intermediate values of the selected mean bias voltages.

7. The method of claim 1, further comprising estimating, when a first candidate among the candidates of the mean bias voltage is out of the corresponding confidence interval, a second candidate of the mean bias voltage for the program state corresponding to the first candidate by utilizing a gaussian modelling algorithm.

8. The method of claim 1, wherein the estimating of the candidates of the mean bias voltage is performed when the target data is read utilizing the source read voltages and the reading of the target data fails.

9. The method of claim 8, wherein initial values of the source read voltages are default values.

10. The method of claim 9, further comprising updating the source read voltages to the target read voltages.

11. A controller comprising:
    a mean-bias manager suitable for estimating candidates of a mean bias voltage based on source read voltages corresponding to respective program states;
    a reliability interval manager suitable for determining whether the candidates of the mean bias voltage are within confidence intervals respectively corresponding to the program states, and selecting the candidates of the mean bias voltage when the candidates of the mean bias voltage are within confidence intervals, respectively;
    a read bias manager suitable for deciding target read voltages based on selected mean bias voltages or the selected candidates of the mean bias voltage; and
    a processor suitable for reading target data according to the target read voltages.

12. The controller of claim 11, wherein the mean-bias manager estimates the candidates of the mean bias voltage by utilizing the source read voltages and constants corresponding to the source read voltages, respectively.

13. The controller of claim 12, wherein the mean-bias manager further obtains the constants by utilizing numbers of "1" cells according to the source read voltages, numbers of "1" cells according to ideal mean bias voltages corresponding to the program states and widths of voltage windows corresponding to the program states.

14. The controller of claim 11, wherein each of the confidence intervals is a voltage range having a set number of "1" cells relative to a number "0" cells, or vice versa, according to ideal mean bias voltages.

15. The controller of claim 11, wherein the read bias manager decides, as the target read voltages, read voltages having intermediate values of the selected mean bias voltages.

16. The controller of claim 11, wherein the read bias manager estimates, when a first candidate among the candidates of the mean bias voltage is out of the corresponding confidence interval, a second candidate of the mean bias voltage for the program state corresponding to the first candidate by utilizing a gaussian modelling algorithm.

17. The controller of claim 11, wherein the read bias manager estimates the candidates of the mean bias voltage when the target data is read utilizing the source read voltages and the reading of the target data fails.

18. The controller of claim 17, wherein initial values of the source read voltages are default values.

19. The controller of claim 18, wherein the read bias manager further updates the source read voltages to the target read voltages.

20. A memory system comprising:
    a memory device: and
    a controller suitable for controlling the memory device to read data stored therein,
    wherein the controller is suitable for:
    estimating mean bias voltages based on source read voltages corresponding to respective program states;
    determining whether the mean bias voltages are within set intervals respectively corresponding to the program states;
    when it is determined that the mean bias voltages are within the corresponding set intervals, determining target read voltages based on the mean bias voltages, respectively;
    reading target data from the memory device based on one of the target read voltages; and
    updating the target read voltages as the source read voltages.

* * * * *